US012027193B2

(12) United States Patent
Go et al.

(10) Patent No.: US 12,027,193 B2
(45) Date of Patent: Jul. 2, 2024

(54) MEMORY DEVICE FOR PERFORMING SMART REFRESH OPERATION BY COUNTING RECEIVED ADDRESS

(71) Applicant: SK hynix Inc., Gyeonggi-do (KR)

(72) Inventors: Byeong Yong Go, Gyeonggi-do (KR); Woongrae Kim, Gyeonggi-do (KR); Hoiju Chung, Gyeonggi-do (KR); Saeng Hwan Kim, Gyeonggi-do (KR); Yoonna Oh, Gyeonggi-do (KR); Chul Moon Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 9 days.

(21) Appl. No.: 17/731,375

(22) Filed: Apr. 28, 2022

(65) Prior Publication Data

US 2023/0118249 A1   Apr. 20, 2023

(30) Foreign Application Priority Data

Oct. 20, 2021   (KR) ......................... 10-2021-0140262

(51) Int. Cl.
*G11C 11/406*   (2006.01)
*G11C 11/408*   (2006.01)
*G11C 11/4093*   (2006.01)

(52) U.S. Cl.
CPC .. *G11C 11/40615* (2013.01); *G11C 11/40618* (2013.01); *G11C 11/4087* (2013.01); *G11C 11/4093* (2013.01)

(58) Field of Classification Search
CPC ........ G11C 11/40615; G11C 11/40618; G11C 11/4087; G11C 11/4093; G11C 11/40603
See application file for complete search history.

(56) References Cited

U.S. PATENT DOCUMENTS

| 6,111,799 A * | 8/2000 | Uchida ................ G11C 29/832 257/E27.081 |
| 2023/0067144 A1* | 3/2023 | Cho ................... G11C 11/40603 |
| 2023/0077248 A1* | 3/2023 | Go .......................... G11C 29/72 |
| 2023/0111467 A1* | 4/2023 | Cho ...................... G11C 29/783 365/185.09 |

FOREIGN PATENT DOCUMENTS

| KR | 10-2015-0085485 A | 7/2015 |
| KR | 10-2017-0108431 A | 9/2017 |

* cited by examiner

*Primary Examiner* — Sultana Begum
(74) *Attorney, Agent, or Firm* — IP & T GROUP LLP

(57) ABSTRACT

A memory device may include: a memory bank comprising a plurality of memory blocks, each divided into a normal area and a row hammer area, a command control circuit suitable for performing an access operation on the normal area in response to an active command, an internal command generation circuit suitable for generating an internal command in response to a precharge command, a target address generation circuit suitable for saving a count for each logic level combination of a received address in the row hammer area by performing an access operation on the row hammer area in response to the internal command, and setting an address corresponding to the count as a target address when the count satisfies a preset condition, and a refresh control circuit suitable for controlling a smart refresh operation on the target address.

19 Claims, 8 Drawing Sheets

MEMORY DEVICE FOR PERFORMING SMART REFRESH OPERATION BY COUNTING RECEIVED ADDRESS

CROSS-REFERENCE TO RELATED APPLICATION

This application claims priority under 35 U.S.C. § 119 to Korean Patent Application No. 10-2021-0140262, filed on Oct. 20, 2021, the contents of which are incorporated herein by reference in its entirety.

BACKGROUND

1. Field

Various embodiments relate to a semiconductor circuit, and particularly, to a memory device for performing a smart refresh operation and a memory system including the same.

2. Discussion of the Related Art

A semiconductor memory device includes a plurality of memory cells that store data. Each memory cell may include a capacitor and a transistor. Data is stored by charging or discharging the capacitor, and the amount of charge stored in the capacitor should be consistently retained. However, the amount of charge stored in the capacitor may change due to various effects, including the presence of a voltage difference with a peripheral circuit. When the amount of charge stored in the capacitor changes, the data stored in the capacitor changes and thus may be lost. Some semiconductor memory devices perform a refresh operation in order to prevent such a data loss.

Even when a refresh operation is performed, the ability to prevent data loss may not be possible in all cases as the degree of integration increases in these devices. For example, increasing degrees of integration reduce the distance between memory cells and also the distance between the word lines coupled to respective ones of the memory cells. The reduction in distance between the word lines may allow interference to occur between adjacent word lines. This, in turn, may make it difficult to retain the data stored in the memory cells coupled to these word lines. Consequently, the probability of data loss increases.

SUMMARY

Various embodiments are directed to a memory device which additionally includes a memory area for saving input count information on logic level combinations of an address, and performs a smart refresh operation of refreshing word lines adjacent to a word line which has been most frequently enabled, according to results obtained by counting all the logic level combinations of the address, and a memory system including the same.

The technical problems of the present disclosure are not limited to those mentioned above, and other technical problems which are not mentioned can be clearly understood by the person skilled in the art from the following descriptions.

In an embodiment, a memory device may include: a memory bank comprising a plurality of memory blocks, each divided into a normal area and a row hammer area; a command control circuit suitable for performing an access operation on the normal area in response to an active command; an internal command generation circuit suitable for generating an internal command in response to a precharge command; a target address generation circuit suitable for saving a count for each logic level combination of a received address in the row hammer area by performing an access operation on the row hammer area in response to the internal command, and setting an address corresponding to the count as a target address when the count satisfies a preset condition; and a refresh control circuit suitable for controlling a smart refresh operation on the target address.

In an embodiment, a method of operating a memory device, which includes a first memory bank having a plurality of memory blocks each divided into a first normal area and a first row hammer area and a second memory bank having a plurality of memory blocks each divided into a second normal area and a second row hammer area, the method may include: performing an access operation on the first and second normal areas according to a bank interleaving method, in which an active section for the first memory bank partially overlaps a precharge section for the second memory bank and an active section for the second memory bank partially overlaps a precharge section for the first memory bank; generating an internal command in response to a precharge command corresponding to the precharge section of the first or second memory bank in a row hammer enable section; saving a count for each logic level combination of a received address in the first or second row hammer area by performing an access operation on the first or second row hammer area in response to the internal command, and setting an address corresponding to the count as a target address when the count satisfies a preset condition; and performing a smart refresh operation on the target address.

In an embodiment, a memory device may include: a memory bank comprising a plurality of memory blocks, each including a normal area and a row hammer area; a command control circuit suitable for performing an access operation on the normal area in response to an active command; a target address generation circuit suitable for: determining a count for each logic level combination of each of one or more access addresses among a plurality of addresses of the memory bank in response to a precharge command, storing the count values in the row hammer area, and determining, as a target address, an access address having a highest count value among the access addresses; and a refresh control circuit suitable for refreshing one or more word lines adjacent to a word line corresponding to the target address, among a plurality of word lines in the memory bank.

In accordance with the present embodiments, the memory device may additionally the row hammer area for saving input count information on logic level combinations of an address, and perform the smart refresh operation of refreshing word lines adjacent to a word line which has been most frequently enabled, according to results obtained by counting all the logic level combinations of the address. Through this operation, the memory device may accurately count the input counts of all the logic level combinations of the address, and refresh the word line which has been most frequently enabled and word lines adjacent thereto, thereby minimizing the interference between the word lines.

Furthermore, the memory device may perform an access operation on the normal area in the active section, and perform an access operation on the row hammer area in the precharge section. This operation may minimize the increase in operation time of the active section by the addition of the row hammer area.

DETAILED DESCRIPTION

Figure 1:
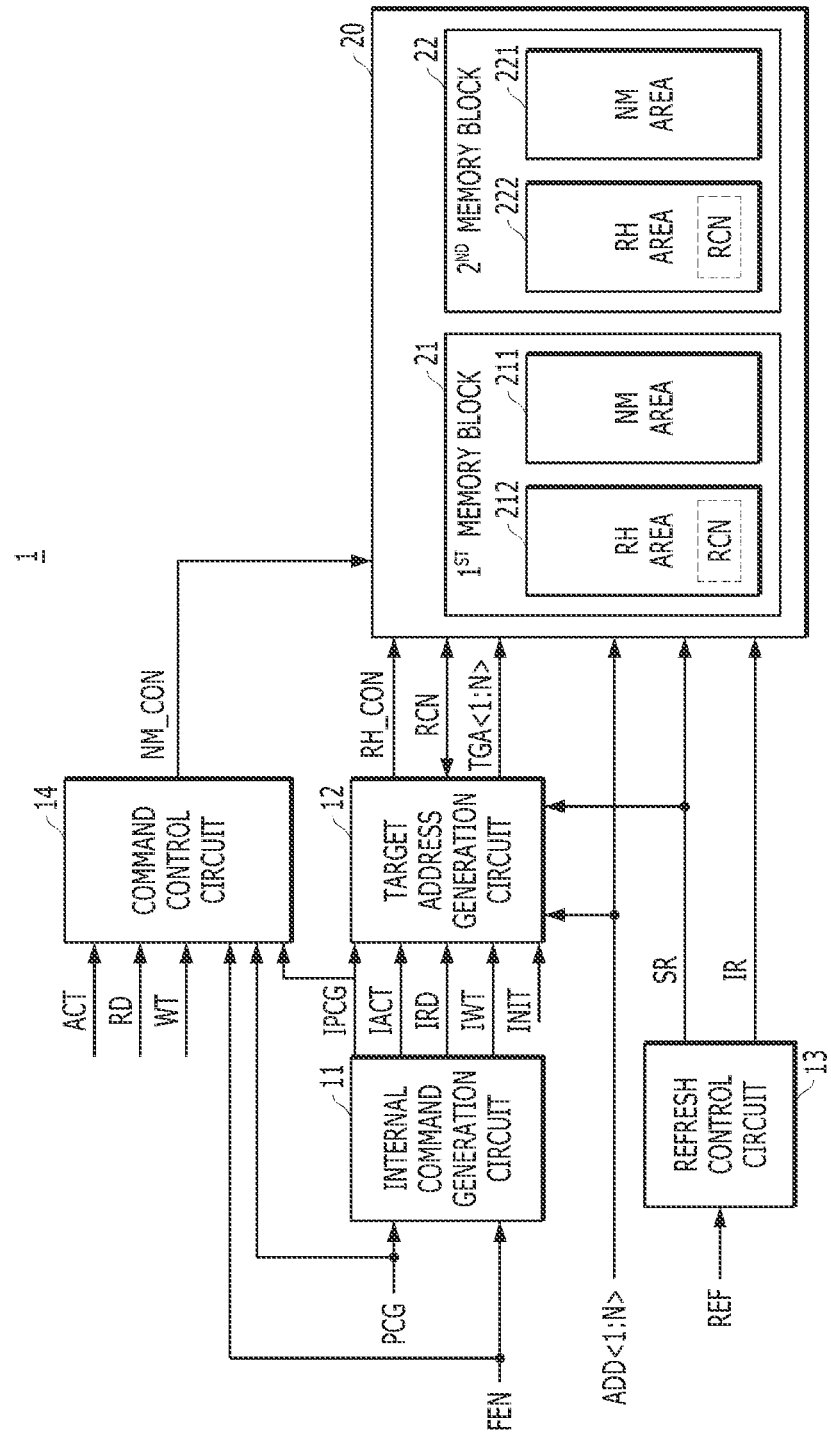
FIG. 1 illustrates an embodiment of a memory device.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware-for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor (s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a diagram for describing an embodiment of a memory device 1 which may include an internal command generation circuit 11, a target address generation circuit 12, a refresh control circuit 13, a command control circuit 14 and a memory bank 20.

The memory bank 20 may include a plurality of memory blocks 21 and 22 which include normal areas (NM AREA) 211 and 221 and row hammer areas (RH AREA) 212 and 222, respectively. In an embodiment, the memory bank 20 may include a first memory block 21 and a second memory block 22. For reference, FIG. 1 illustrates that the memory bank 20 includes two memory blocks 21 and 22. However, this is only an embodiment. In another embodiment, the memory bank 20 may include a larger number of memory blocks. The following description will be based on the assumption that the memory bank 20 includes two memory blocks 21 and 22.

The first memory block 21 and the second memory block 22 may include the normal areas 211 and 221 and the row hammer areas 212 and 222, respectively.

The first memory block 21 and the second memory block 22 may include the normal (NM) areas 211 and 221 and the row hammer (RH) areas 212 and 222, respectively.

The normal areas 211 and 221 may store normal data.

The row hammer areas 212 and 222 may save a count RCN for each logic level combination of an address ADD<1:N> input to the memory bank 20.

The internal command generation circuit 11 may receive a precharge command PCG from an external device (e.g., memory controller). Further, the internal command generation circuit 11 may receive a row hammer enable signal FEN which is selected whether to enable by a mode register set (MRS).

The internal command generation circuit 11 may generate an internal active command IACT, an internal read command IRD, an internal write command IWT and an internal precharge command IPCG on the basis of the precharge command PCG and the row hammer enable signal FEN.

The internal command generation circuit 11 may generate the internal active command IACT in response to the precharge command PCG input following an active command ACT, while the row hammer enable signal FEN is activated (row hammer enable state).

After a predetermined time has elapsed, the internal command generation circuit 11 may generate the internal precharge command IPCG. The internal command generation circuit 11 may generate no signals (regardless whether the precharge command PCG is input) while the row hammer enable signal EN is inactivated (row hammer disable state). The internal command generation circuit 11 may enable the internal active command IACT in response to the precharge command PCG during a preset time, and then may sequentially generate the internal read command IRD and the internal write command IWT in an active section of the internal active command IACT and may generate the internal precharge command IPCG in response to the disabled internal active command IACT.

The command control circuit 14 may receive the active command ACT, a read command RD, a write command WT and the precharge command PCG from an external device (e.g., memory controller). Further, the command control circuit 14 may receive the row hammer enable signal FEN which is selected whether to enable by the mode register set (MRS). Further, the command control circuit 14 may receive the internal precharge command IPCG from the internal command generation circuit 11.

The command control circuit 14 may perform an access operation on the normal areas 211 and 221 of the memory bank 20 in response to the active command ACT. The command control circuit 14 may activate the memory bank 20 in response to the active command ACT, and read/write normal data from/to the normal areas 211 and 221 of the memory bank 20 in response to the read command RD and the write command WT. The command control circuit 14 may precharge the memory bank 20 in response to the internal precharge command IPCG while the row hammer enable signal FEN is enabled.

For reference, the memory device 1 may include the mode register set (MRS) for setting its operating state information. Here, the mode register set (MRS) may set a value of an internal signal (e.g., the row hammer enable signal FEN) used in the memory device 1 in response to an external command input from an external device (e.g., memory controller).

Furthermore, in the above description, the operation of the internal command generating circuit 11 and the command control circuit 14 is controlled in response to the row hammer enable signal FEN. However, according to an embodiment, the internal command generation circuit 11 and the command control circuit 14 may be set to perform an operation corresponding to enabled state of the row hammer enable signal FEN without receiving of the row hammer enable signal FEN. For example, different from the drawing, the internal command generating circuit 11 may operate by only receiving the precharge command PCG without receiving of the row hammer enable signal FEN. Further, the command control circuit 14 may operate by only receiving the active command ACT, the read command RD, the write command WT, and the internal precharge command IPCG without receiving of the row hammer enable signal FEN and the precharge command PCG.

Additionally, the command control circuit 14 may precharge the memory bank 20 in response to the precharge command PCG while the row hammer enable signal FEN is disabled. The command control circuit 14 may control operations on the normal areas 211 and 221 of the memory bank 20 (e.g., an active operation, a read/write operation and a precharge operation) by generating a normal area control signal NM_CON in response to the active command ACT, the read command RD, the write command WT, the precharge command PCG, the internal precharge command IPCG and the row hammer enable signal FEN.

The target address generation circuit 12 may perform an access operation on the row hammer areas 212 and 222 of the memory bank 20 in response to the internal active command IACT. The target address generation circuit 12 may read/write the count RCN for each logic level combination of the address ADD<1:N> from/to the row hammer areas 212 and 222 of the memory bank 20 in response to the internal read command IRD and the internal write command IWT, while the internal active command IACT is activated. The target address generation circuit 12 may perform a precharge operation on the row hammer areas 212 and 222 of the memory bank 20 in response to the internal precharge command IPCG.

Since the internal active command IACT is a command generated in response to the precharge command PCG input following the active command ACT, the access operation on the normal areas 211 and 221, performed by the command control circuit 14, and the access operation on the row hammer areas 212 and 222, performed by the target address generation circuit 12, may be performed in operation periods which do not overlap each other. Thus, the access operation on the normal areas 211 and 221 (performed by the command control circuit 14 in response to the active command ACT) may have been already completed at the point of time that the precharge command PCG is input. Therefore, the access operation on the row hammer areas 212 and 222 (performed by the target address generation circuit in response to the internal active command IACT generated through the precharge command) may be performed after the access operation on the normal areas 211 and 221 (as performed by the command control circuit 14) has been completed.

In one embodiment, the target address generation circuit 12 may perform an access operation on the row hammer areas 212 and 222 of the memory bank 20 in response to the internal active command IACT. Additionally, the target address generation circuit 12 may save the count RCN for each logic level combination of the address ADD<1:N> in the row hammer areas 212 and 222 of the memory bank 20.

When the count RCN saved in the row hammer areas 212 and 222 of the memory bank 20 satisfies a preset condition, the target address generation circuit 12 may set an address corresponding to the count RCN as a target address TGA<1:N>.

The target address generation circuit 12 may perform an internal read operation on the row hammer areas 212 and 222 in response to the internal read command IRD, and may perform an internal write operation on the roar hammer areas 212 and 222 in response to the internal write command IWT, while the internal active command IACT applied from the internal command generation circuit 11 is enabled.

The target address generation circuit 12 may read the count RCN for each logic level combination of the address ADD<1:N> saved in the row hammer areas 212 and 222. In so doing, the target address generation circuit 12 may perform the internal read operation on the row hammer areas 212 and 222 in response to the internal read command IRD received from the internal command generation circuit 11. The target address generation circuit 12 may increase the read count RCN through up-counting and save the increased count RCN in the row hammer areas 212 and 222 by performing the internal write operation on the row hammer areas 212 and 222 in response to the internal write command IWT received from the internal command generation circuit 11.

The target address generation circuit 12 may receive the address ADD<1:N> from an external device (e.g., memory controller), The address ADD<1:N> may include N bits, where N may be a natural number greater than or equal to 2. Therefore, a logic level combination of the address ADD<1:N> may indicate which combination the logic levels of the N bits contained in the address ADD<1:N> has.

The target address generation circuit 12 may generate the count RCN for each logic level combination of the address ADD<1:N> during the internal read operation, and then save the count RCN in the row hammer areas 212 and 222 during the internal write operation.

In an embodiment, the target address generation circuit 12 may generate the count RCN of '3' by counting the number of times that an address having a first logic level combination is received during the internal read operation. The target address generation circuit 12 may then save the generated count RCN in the row hammer areas 212 and 222 during the internal write operation, such that a value corresponding to the address having the first logic level combination (among the counts RCN saved in the row hammer areas 212 and 222) becomes '3'.

In another embodiment, the target address generation circuit 12 may generate the count RCN of '7' by counting the number of times that an address having a second logic level combination is received during the internal read operation. The target address generation circuit 12 may then save the generated count RCN in the row hammer areas 212 and 222 during the internal write operation, such that a value corresponding to the address having the second logic level combination (among the counts RCN saved in the row hammer areas 212 and 222) becomes '7'.

The operation performed by the target address generation circuit 12 to generate the count RCN for each logic level combination of the address ADD<1:N> during the internal read operation may indicate an operation of reading the count RCN for each logic level combination of the address ADD<1:N>, as saved in the row hammer areas 212 and 222, into the target address generation circuit 12 during the internal read operation. The read count RCN may then be updated through up-counting. Therefore, the count RCN transferred to the row hammer areas 212 and 222 from the target address generation circuit 12 during the internal write operation may indicate the count RCN updated by increasing the count RCN read during the internal read operation through up-counting. In other words, the target address generation circuit 12 may read the count RCN for each logic level combination of the address ADD<1:N> (as saved in the row hammer areas 212 and 222) during the internal read operation, update the read count RCN through up-counting, and save the updated count RCN in the row hammer areas 212 and 222 during the internal write operation.

In an embodiment, the target address generation circuit 12 may read the count RCN having a value of '3' (as saved in the row hammer areas 212 and 222 in response to the address having the first logic level combination) during the internal read operation. The target address generation circuit 12 may then update the read count RCN into the count RCN having a value of '4' through up-counting and save the updated count RCN in the row hammer areas 212 and 222 during the internal write operation, such that a value corresponding to the address having the first logic level combination (among the counts RCN saved in the row hammer areas 212 and 222) becomes '4'.

In another embodiment, the target address generation circuit 12 may read the count RCN having a value of '7' (as saved in the row hammer areas 212 and 222 in response to the address having the second logic level combination) during the internal read operation. The target address generation circuit 12 may then update the read count RCN into the count RCN having a value of '8' through up-counting and save the updated count RCN in the row hammer areas 212 and 222 during the internal write operation, such that a value corresponding to the address having the second logic level combination (among the counts RCN saved in the row hammer areas 212 and 222) becomes '8'.

In still another embodiment, even when the count RCN having a value of '0' as the initial value is saved in the row hammer areas 212 and 222 in response to an address having a third logic level combination, the target address generation circuit 12 may read the count RCN during the internal read operation, update the read count RCN into the count RCN having a value of '1' through up-counting, and save the updated count RCN in the row hammer areas 212 and 222 during the internal write operation. These operations may be performed so that a value corresponding to the address having the third logic level combination, among the counts RCN saved in the row hammer areas 212 and 222, becomes '1'.

When the count RCN for each logic level combination of the address ADD<1:N> (as saved in the row hammer areas 212 and 222) satisfies the preset condition, the target address generation circuit 12 may set the address ADD<1:N> corresponding to the count RCN as the target address TGA<1:N>.

In an embodiment, the target address generation circuit 12 may select one count having the largest (highest) value among the counts RCN for the respective logic level combinations of the address ADD<1:N> saved in the row hammer areas 212 and 222, and then set the address ADD<1:N> corresponding to the selected count as the target address TGA<1:N>. Here, the count RCN that satisfies the preset condition may be one count having the largest (highest) value among the counts RCN for the respective logic level combinations of the address ADD<1:N> saved in the row hammer areas 212 and 222.

The target address generation circuit 12 may output the target address TGA<1:N> stored therein to the memory bank 20 in response to a smart refresh signal SR received from the refresh control circuit 13. For example, when the refresh control circuit 13 generates the smart refresh signal SR to perform the smart refresh operation, the target address generation circuit 12 may output the target address TGA<1:N> to the memory bank 20 to perform the smart refresh operation on the target address TGA<1:N>.

The smart refresh operation may include an operation of refreshing one or more word lines disposed adjacent to a word line corresponding to the target address TGA<1:N>, among a plurality of word lines WL1, WL2, WL3, . . . included in the memory bank 20. In an embodiment, when the word line corresponding to the target address TGA<1:N>, among the plurality of word lines WL1, WL2, WL3, . . . included in the memory bank 20, is a $J^{th}$ word line, not only the $J^{th}$ word line but also a $(J+1)^{th}$ word line and/or a $(J-1)^{th}$ word line adjacent thereto may be selected and refreshed during the smart refresh operation on the target address TGA<1:N>. Here, J is a natural number equal to or greater than 1.

The target address generation circuit 12 may perform the internal write operation after the smart refresh operation is performed, to thereby reset the count corresponding to the target address TGA<1:N> among the counts RCN for the respective logic level combinations of the address ADD<1:N>, which are saved in the row hammer areas 212 and 222.

The refresh control circuit 13 may receive a refresh command REF from an external device (e.g., memory controller).

The refresh control circuit 13 may generate the smart refresh signal SR and an internal refresh signal IR based on the refresh command REF.

The refresh control circuit 13 may generate the smart refresh signal SR, which is enabled when the refresh command REF is input, in a form corresponding to a condition for performing the smart refresh operation. The refresh control circuit 13 may generate the smart refresh signal SR and transfer the generated smart refresh signal SR to the memory bank 20 and the target address generation circuit 12, thereby controlling the smart refresh operation on the target address TGA<1:N>.

The refresh control circuit 13 may generate the internal refresh signal IR, which is enabled when the refresh command REF is input, in a form corresponding to a condition for performing a self refresh operation. The refresh control circuit 13 may generate the internal refresh signal IR to perform the self refresh operation.

The target address generation circuit 12 may initialize all the counts RCN, saved in the row hammer areas 212 and 222 of the memory bank 20, in response to an initialization signal INIT input during a power-up period and boot-up operation for the memory device 1 to start an operation. The bits of each of the initialized counts RCN may all have a logic low level of '0'.

The target address generation circuit 12 may generate a row hammer control signal RH_CON in response to the internal active command IACT, the internal precharge command IPCG, the internal read command IRD, the internal write command IWT and the initialization signal INIT, and may control the operations on the row hammer areas 212 and 222 of the memory bank 20, for example, the active operation, the precharge operation, the internal read operation, the internal write operation and the initialization operation.

In an embodiment, the count RCN described in the above embodiment may include a predefined number of bits. For example, the count RCN may include six bits.

Figure 2:
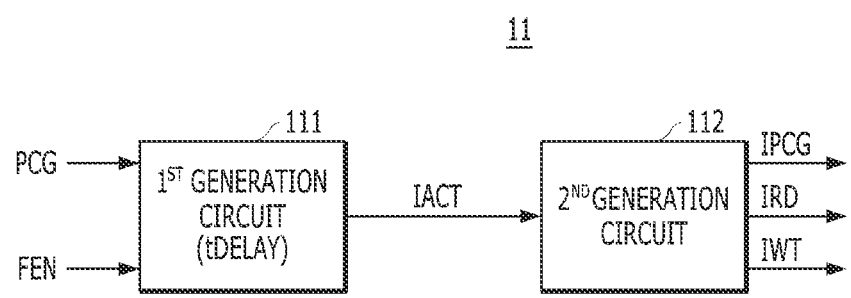
FIG. 2 illustrates an embodiment of an internal command generation circuit.

FIG. 2 is a diagram for describing an embodiment of the internal command generation circuit 11, among the components of the memory device disclosed in FIG. 1.

Referring to FIG. 2, the internal command generation circuit 11 may include a first generation circuit 111 and a second generation circuit 112.

The first generation circuit 111 may enable the internal active command IACT for a preset time tDELAY in response to the precharge command PCG. The first generation circuit 111 may enable the internal active command IACT for the preset time in response to the precharge command PCG, input while the row hammer enable signal FEN is enabled. The first generation circuit 111 may retain the internal active command IACT in a disabled state, regardless of whether the precharge command PCG is input, while the row hammer enable signal FEN is disabled.

The second generation circuit 112 may receive the internal active command IACT and sequentially generate the internal read command IRD, the internal write command IWT and the internal precharge command IPCG. The second generation circuit 112 may sequentially generate the internal read command IRD and the internal write command IWT in an active section of the internal active command IACT, and may generate the internal precharge command IPCG in response to the disabled internal active command IACT.

Figure 3:
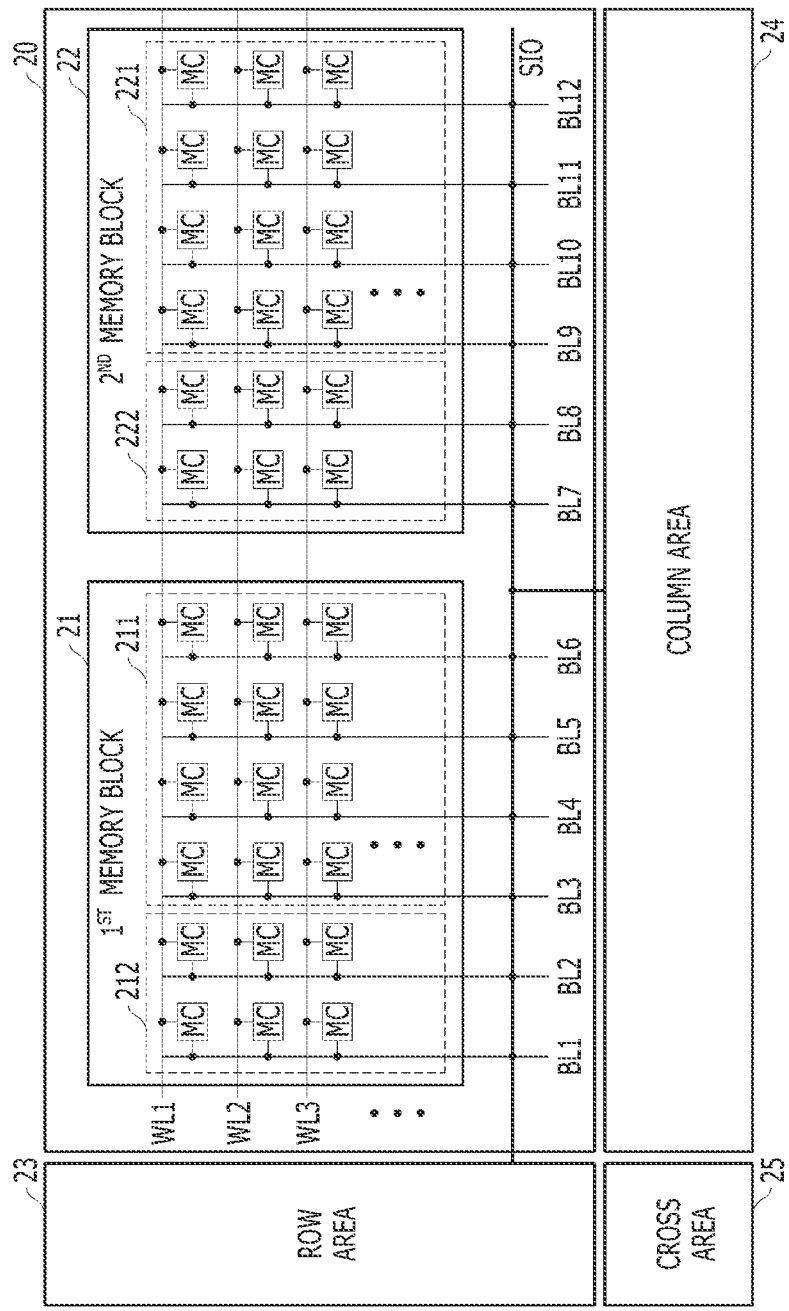
FIG. 3 illustrates an embodiment of a memory bank.

FIG. 3 is a diagram for describing an embodiment of the memory bank 20, among the components of the memory device disclosed in FIG. 1.

Referring to FIG. 3, the memory bank 20 may include the first memory block 21 and the second memory block 22.

A row area 23 may be located on any one side of the right and left sides of the memory bank 20. FIG. 2 illustrates an example where row area 23 is located on the left side of the memory bank 20. Furthermore, a column area 24 may be located on any one side of the top and bottom sides of the memory bank 20. FIG. 2 illustrates an example where the column area 24 is located on the bottom side of the memory bank 20. Furthermore, a cross area 25 may be located between the row area 23 and the column area 24.

The memory bank 20 may include a plurality of memory cells MC coupled between the plurality of word lines WL1, WL2, WL3 . . . and a plurality of bit lines BL1, BL2, BL3, BL4, BL5, BL6, BL7, BL8, BL9, BL10, BL11 and BL12.

The first and second memory blocks 21 and 22 included in the memory bank 20 may share the plurality of word lines WL1, WL2, WL3, . . . , which may be driven at the same time. For example, the plurality of word lines WL1, WL2, WL3, . . . may be simultaneously driven by a word line driver located in the row area 23.

In the present embodiment, the case in which the first and second memory blocks 21 and 22 share the plurality of word lines WL1, WL2, WL3, . . . , and drive the plurality of word lines WL1, WL2, WL3, . . . at the same time is taken as an example. However, this is only an embodiment. In one embodiment, a plurality of word lines corresponding to the first memory block 21 and a plurality of word lines corresponding to the second memory block 22 may be independently driven. For example, a sub word line driver may be further included between the first and second memory blocks 21 and 22. Through the sub world line driver, the plurality of word lines corresponding to the first memory block 21 and the plurality of word lines corresponding to the second memory block 22 may be shared and driven, or may be independently driven.

The bit lines BL1, BL2, BL3, BL4, BL5 and BL6 corresponding to the first memory block 21 and the bit lines BL7, BL8, BL9, BL10, BL11 and BL12 corresponding to the second memory block 22 may be physically separated from each other.

The memory cells MC coupled between some bit lines BL1 and BL2 (among the bit lines BL1, BL2, BL3, BL4, BL5 and BL6) included in the first memory block 21, and the word lines WL1, WL2, WL3, . . . and the memory cells MC coupled between some bit lines BL7 and BL8 (among the bit lines BL7, BL8, BL9, BL10, BL11 and BL12) included in the second memory block 22, and the word lines WL1, WL2, WL3, . . . may be used as the row hammer areas 212 and 222.

The memory cells MC coupled between other bit lines BL3, BL4, BL5 and BL6 which do not overlap the bit lines BL1 and BL2 (among the bit lines BL1, BL2, BL3, BL4, BL5 and BL6) included in the first memory block 21, and the plurality of word lines WL1, WL2, WL3, . . . and the memory cells MC coupled between other bit lines BL9, BL10, BL11 and BL12 which do not overlap the bit lines BL7 and BL8 (among the bit lines BL7, BL8, BL9, BL10, BL11 and BL12) included in the second memory block 22, and the plurality of word lines WL1, WL2, WL3, . . . may be used as the normal areas 211 and 221.

The bit lines BL3, BL4, BL5 and BL6/BL9, BL10, BL11 and BL12 included in the normal areas 211 and 221 and the bit lines BL1 and BL2/BL7 and BL8 included in the row hammer areas 212 and 222 may be coupled to the column area 24 through a segment line SIO shared thereby.

In one embodiment, the column area 24 may include a data input/output circuit configured to output data, transferred through the segment line SIO, to a destination (e.g., memory controller) outside of the memory device 1, or transfer data received from a source outside the memory device 1 to the segment line SIO.

When the internal read operation is performed in response to the internal read command IRD generated by the internal command generation circuit 11, the target address generation circuit 12 may read (through the segment line SIO) the counts RCN for the respective logic level combinations of the address ADD<1:N>, which are saved in the memory cells MC coupled between the plurality of word lines WL1, WL2, WL3, . . . and the bit lines BL1 and BL2/BL7 and BL8 corresponding to the row hammer areas 212 and 222. For example, the target address generation circuit 12 may perform an internal read operation of reading, through the segment line SIO, the count RCN saved in a first selected memory cell coupled to a word line corresponding to an input address, among the memory cells MC included in the row hammer areas 212 and 222.

When the internal write operation is performed in response to the internal write command IWT generated by the internal command generation circuit 11, the target address generation circuit 12 may update the counts RCN for the respective logic level combinations, read by the internal read operation, through up-counting. Then, the target address generation circuit 12 may write, through the segment line SIO, the updated counts RCN to the memory cells MC coupled between the plurality of word lines WL1, WL2, WL3, . . . and the bit lines BL1 and BL2/BL7 and BL8 corresponding to the row hammer areas 212 and 222. For example, the target address generation circuit 12 may perform the internal write operation of updating the count RCN read by the internal read operation through up-counting, transferring the updated count RCN to the first selected memory cell coupled to the word line (corresponding to the input address among the memory cells MC included in the row hammer areas 212 and 222) through the segment line SIO, and saving the transferred count RCN in the first selected memory cell.

During a normal read operation performed in response to the read command RD, the command control circuit 14 may read normal data from the memory cells MC coupled between the word lines WL1, WL2, WL3, . . . and the bit lines BL3, BL4, BL5 and BL6/BL9, BL10, BL11 and BL12 corresponding to the normal areas 211 and 221, and may transfer the read normal data to a data output circuit included in the column area 24 through the segment line SIO. For example, the command control circuit 14 may perform the normal read operation of reading normal data from a second selected memory cell coupled to the word line corresponding to the input address (among the memory cells MC included in the normal areas 211 and 221), and of transferring the read normal data to the data output circuit included in the column area 24 through the segment line SIO.

During a normal write operation performed in response to the write command WT, the command control circuit 14 may write normal data (as received through the segment line SIO from a data input circuit included in the column area 24) to the memory cells MC coupled between the word lines WL1, WL2, WL3, . . . and the bit lines BL3, BL4, BL5 and BL6/BL9, BL10, BL11 and BL12 corresponding to the normal areas 211 and 221. For example, the command control circuit 14 may perform the normal write operation of storing normal data (as received through the segment line SIO from the data input circuit included in the column area 24) to the second selected memory cell coupled to the word line corresponding to the input address among the memory cells MC included in the normal areas 211 and 221.

Figure 4:
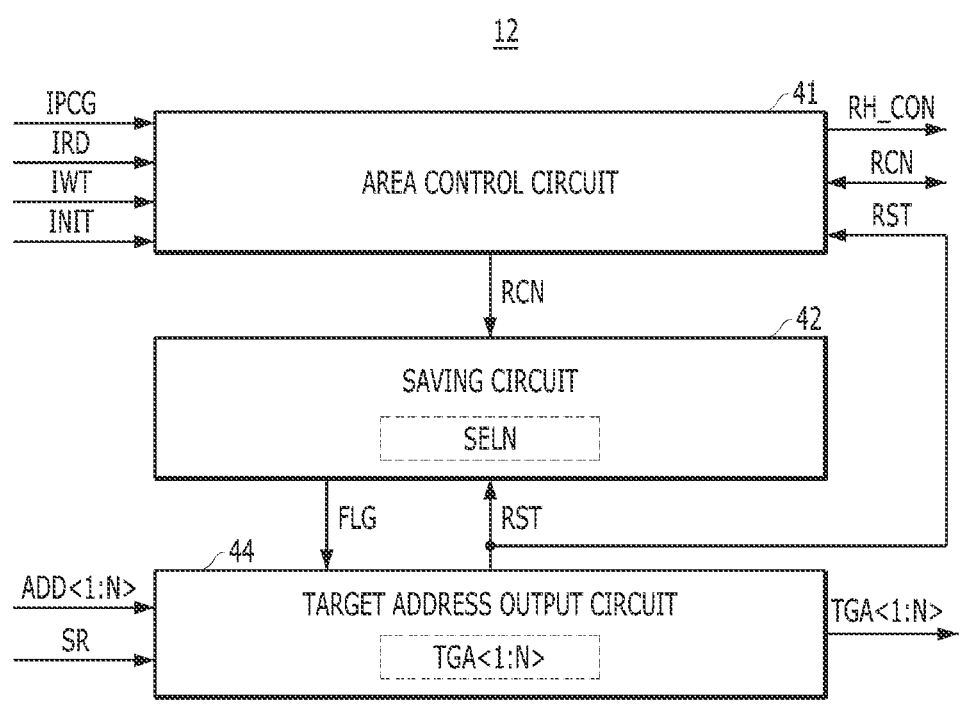
FIG. 4 illustrates an embodiment of a target address generation circuit.

FIG. 4 is a diagram for describing an embodiment of the target address generation circuit 12, among the components of the memory device disclosed in FIG. 1.

Referring to FIG. 4, the target address generation circuit 12 may include an area control circuit 41, a saving circuit 42 and a target address output circuit 44.

The area control circuit 41 may read the count RCN corresponding to an input address by performing an internal read operation on the row hammer areas 212 and 222 corresponding to the input address. This operation may be performed in response to the internal read command IRD, while the internal active command IACT is enabled. The area control circuit 41 may update the count RCN (as read by the internal read operation on the row hammer areas 212 and 222) through up-counting and may save the updated count RCN in the row hammer areas 212 and 222 corresponding to the input address by performing an internal write operation on the row hammer areas 212 and 222. This operation may be performed in response to the internal write command IWT, while the internal active command IACT is enabled.

In one embodiment, the area control circuit 41 may read the count RCN corresponding to the input address by performing an internal read operation on the row hammer areas 212 and 222, in response to the internal read command IRD received from the internal command generation circuit 11. The input address may be an address having any one logic level combination among logic level combinations of the address ADD<1:N> input to the memory device 1. The input address may be input to memory bank 20 in order to select any one word line among the plurality of word lines.

Therefore, the area control circuit 41 may perform an internal read operation of reading, through the segment line SIO, the counts RCN saved in the memory cells MC coupled between any one word line corresponding to the input address, among the word lines WL1, WL2, WL3, . . . and the bit lines BL1 and BL2/BL7 and BL8 corresponding to the row hammer areas 212 and 222. This operation may be performed in response to the internal read command IRD received from the internal command generation circuit 11.

The area control circuit 41 may update the counts RCN, as read by the internal read operation and corresponding to the input address, through up-counting.

Therefore, the area control circuit 41 may perform an internal write operation of saving the counts RCN (updated through up-counting) in the memory cells MC coupled between any one word line corresponding to the input address, among the word lines WL1, WL2, WL3, . . . and the bit lines BL1 and BL2/BL7 and BL8 corresponding to the row hammer areas 212 and 222. This operation may be performed in response to the internal write command IWT received from the internal command generation circuit 11.

The area control circuit 41 may reset the counts RCN saved in the memory cells MC coupled between any one word line corresponding to the input address among the word lines WL1, WL2, WL3, . . . and the bit lines BL1 and BL2/BL7 and BL8 corresponding to the row hammer areas 212 and 222. This operation may be performed in response to a reset signal RST.

The area control circuit 41 may initialize the counts RCN saved in all the memory cells MC coupled between the word lines WL1, WL2, WL3, . . . and the bit lines BL1 and BL2/BL7 and BL8 corresponding to the row hammer areas 212 and 222. This operation may be performed in response to the initialization signal INIT. The bits of each of the initialized counts RCN may all have a logic low level of '0'.

The saving circuit 42 may save a saved count SELN. When the count RCN (which is updated by the area control circuit 41 through an up-counting operation) satisfies the preset condition, the saving circuit 42 may save the updated count RCN (which satisfies the preset condition) as the saved count SELN therein. The saving circuit 42 may reset the saved count SELN which is saved therein in response to the reset signal RST.

When the updated count RCN generated by the area control circuit 41 is greater than the saved count SELN saved in the saving circuit 42 during an active operation on the memory bank 20, the saving circuit 42 may save the updated count RCN as the saved count SELN therein and generate a flag signal FLG. The saving circuit 42 may reset the saved count SELN saved therein in response to the reset signal RST.

The saving circuit 42 may compare the value of the saved count SELN saved therein to the value of the updated count RCN in response to the updated count RCN generated by the area control circuit 41. When the comparison result indicates that the value of the updated count RCN generated by the area control circuit 41 is greater than the value of the saved count SELN saved in the saving circuit 42, the saving circuit 42 may save the updated count RCN generated by the area control circuit 41 as a new saved count SELN therein. When the comparison result indicates that the value of the updated count RCN generated by the area control circuit 41 is less than or equal to the value of the saved count SELN saved in the saving circuit 42, the saving circuit 42 may retain the saved count SELN saved therein. Therefore, the saved count SELN saved in the saving circuit 42 may have the same value as the largest value among all the counts RCN saved in the row hammer areas 212 and 222.

The saving circuit 42 may reset the value of the saved count SELN saved therein in response to the reset signal RST. In an embodiment, the bits of the reset saved count SELN may all have a logic low level of '0'.

The saving circuit 42 may generate the flag signal FLG when the value of the updated count RCN generated by the area control circuit 41 is greater than the value of the saved count SELN saved in the saving circuit 42. The saving circuit 42 may not generate the flag signal FLG when the value of the updated count RCN generated by the area control circuit 41 is less than or equal to the value of the saved count SELN saved in the saving circuit 42.

The target address output circuit 44 may save the input address as the target address TGA<1:N> in response to the flag signal FLG generated by the saving circuit 42. The target address output circuit 44 may output the target address TGA<1:N> to the memory bank 20 during a smart refresh operation. The target address output circuit 44 may generate the reset signal RST after the smart refresh operation is performed.

When the flag signal FLG is generated by the saving circuit 42, it may indicate that the updated count RCN generated by the area control circuit 41 is saved as the new saved count SELN. Therefore, the input address at the point of time that the flag signal FLG is generated may be an input address corresponding to the largest count among all the counts RCN which have been saved in the row hammer areas 212 and 222 until the corresponding point of time. Therefore, the target address TGA<1:N> saved in the target address output circuit 44 may be an address corresponding to the largest count among all the counts RCN saved in the row hammer areas 212 and 222.

The target address output circuit 44 may output the target address TGA<1:N> stored therein to the memory bank 20 in response to the smart refresh signal SR, which is received from the refresh control circuit 13 and which corresponds to the smart refresh operation. Therefore, the refresh control circuit 13 may generate and transfer the smart refresh signal SR to the memory bank 20 and the target address generation circuit 12, such that the smart refresh operation is performed on the target address TGA<1:N> that corresponds to the largest count among all the counts RCN saved in the row hammer areas 212 and 222.

The target address output circuit 44 may generate the reset signal RST after the smart refresh operation is performed. The target address output circuit 44 may generate the reset signal RST, which is enabled when the smart refresh operation is completed, after the smart refresh signal SR corresponding to the smart refresh operation is received from the refresh control circuit 13.

Figure 5:
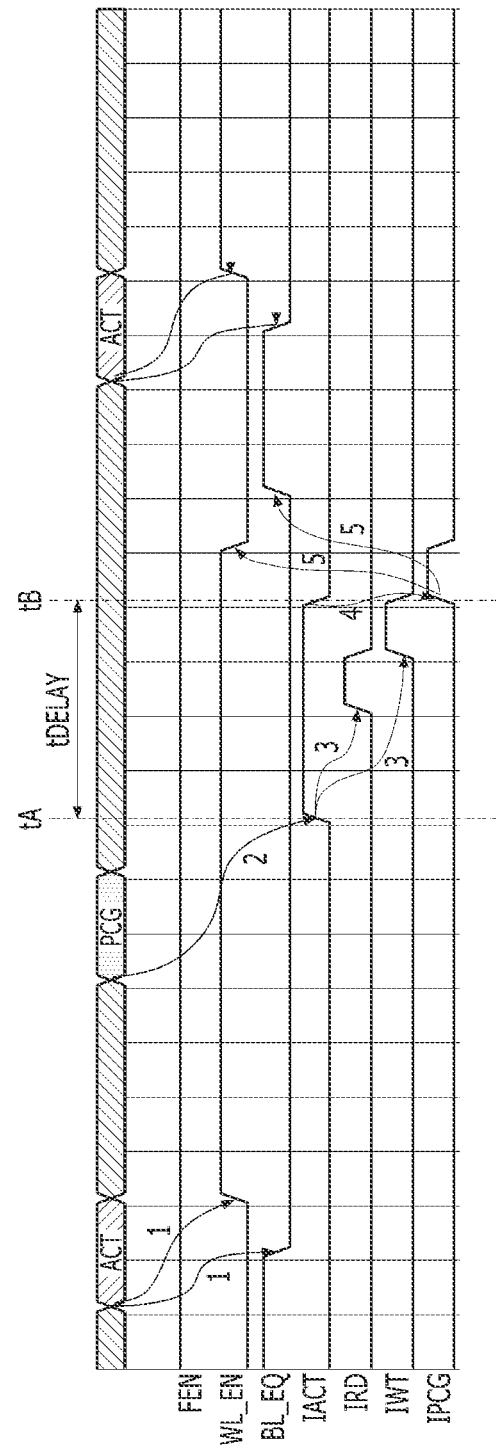
FIG. 5 illustrates an embodiment for operating a memory device.

FIG. 5 is a diagram for describing operation of the memory device of FIG. 1 according to an embodiment. In this embodiment, the active command ACT and the precharge command PCG for the memory bank 20 may be alternately and repeatedly input.

Also, operation of this embodiment may be based on the assumption that the row hammer enable signal FEN retains the state in which it is enabled to a logic high level.

The command control circuit 14 may enable a word line enable signal WL_EN to a logic high level in response to input of a first active command ACT and disable a bit line equalization signal BL_EQ to a logic low level, thereby activating the memory bank 20 (1). The world line enable signal WL_EN and the bit line equalization signal BL_EQ may be generated by the command control circuit 14 to control operation of the memory bank 20.

By enabling the word line enable signal WL_EN, the command control circuit 14 may activate any one word line corresponding to an input address among the plurality of word lines WL1, WL2, WL3, . . . included in the memory bank 20. The command control circuit 14 may disable the bit line equalization signal BL_EQ to a logic low level to disable an equalization operation on the bit lines BL1, BL2, BL3, BL4, BL5, BL6, BL7, BL8, BL9, BL10, BL11 and BL12 coupled to any one word line corresponding to the activated input address. As a result, the current state may be changed to the state in which sense amplification is possible.

Additionally, the command control circuit 14 may perform an access operation on the normal areas 211 and 221, until a first precharge command PCG is input after input of the first active command ACT.

The internal command generation circuit 11 may activate the internal active command IACT to a logic high level in response to the input of the first precharge command PCG (2), and then retain the active state of the internal active command IACT during the preset time tDELAY. For example, the internal command generation circuit 11 may activate the internal active command IACT at a first time point tA, and then inactivate the internal active command IACT at a second time point tB after the preset time tDELAY has elapsed. The target address generation circuit 12 may perform an access operation on the row hammer areas 212 and 222 in response to the activated internal active command IACT.

If the row hammer enable signal FEN is inactivated to a logic low level, the internal command generation circuit 11 may not activate the internal active command IACT. Since the internal active command IACT was not activated, the command control circuit 14 may change the word line enable signal WL_EN to a logic low level in response to the input of the precharge command PCG, and activate the bit line equalization signal BL_EQ to a logic high level. As a result, the memory bank 20 may be precharged.

However, since the row hammer enable signal FEN was activated to a logic high level in FIG. 5, the internal command generation circuit 11 may activate the internal active command IACT during the preset time tDELAY. The command control circuit 14 may change the word line enable signal WL_EN to a logic low level and activate the bit line equalization signal BL_EQ to a logic high level, in response to the input of the precharge command PCG. As a result, the operation for precharging the memory bank 20 may be delayed during the preset time tDELAY in which the internal active command IACT retains an active state.

The internal command generation circuit 11 may sequentially generate the internal read command IRD and the internal write command IWT in the period in which the internal active command IACT retains the active state. The target address generation circuit 12 may perform an internal read operation and an internal write operation on the row hammer areas 212 and 222 in response to the internal read command IRD and the internal write command IWT which are sequentially generated.

The internal command generation circuit 11 may generate the internal precharge command IPCG in response to deactivation of the internal active command IACT (4). The command control circuit 14 may precharge the memory bank 20 in response to the generated internal precharge command IPCG (5). The command control circuit 14 may change the word line enable signal WL_EN to a logic low level in response to the generated internal precharge command IPCG, and activate the bit line equalization signal BL_EQ to a logic high level. As a result, the memory bank 20 (5) may be precharged.

As described above, the internal command generation circuit 11 may activate the internal active command IACT for the preset time tDELAY in response to the input of the precharge command PCG following the active command ACT, and then generate the internal precharge command IPCG. At this time, the command control circuit 14 may precharge the memory bank 20 in response to the internal precharge command IPCG, not the precharge command PCG. Thus, the point of time that the command control circuit 14 precharges the memory bank 20 in response to the internal precharge command IPCG may be delayed by the preset time tDELAY from the point of time that the command control circuit 14 precharges the memory bank 20 in response to the precharge command PCG.

Figure 6:
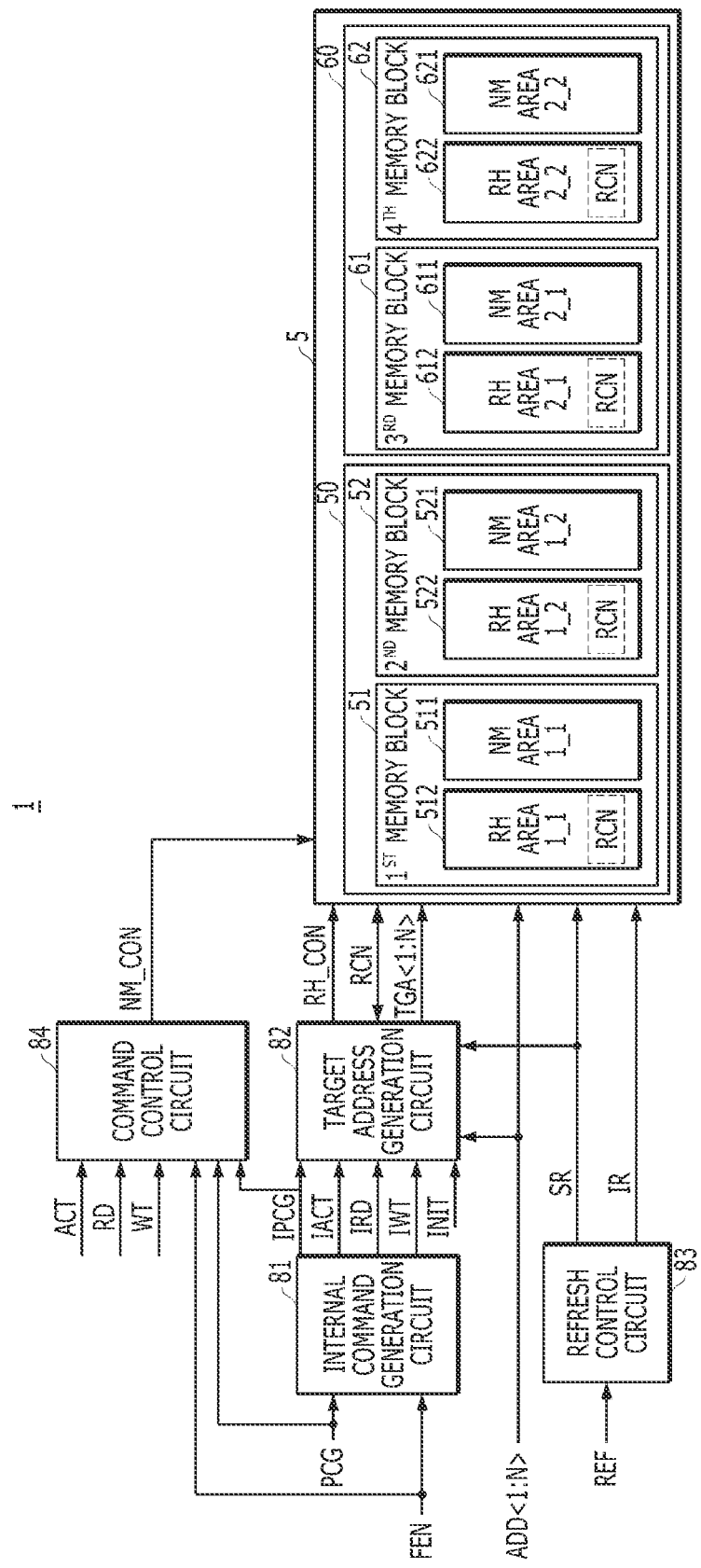
FIG. 6 illustrates an embodiment of a memory device.

FIG. 6 is a diagram for describing an embodiment of memory device 1 which may include a first memory bank 50, a second memory bank 60, an internal command generation circuit 81, a target address generation circuit 82, a refresh control circuit 83 and a command control circuit 84.

The first memory bank 50 may include a first memory block 51 and a second memory block 52, which include first normal areas (NM AREA1_1 and NM AREA1_2) 511 and 521 and first row hammer areas (RH AREA1_1 and RH AREA1_2) 512 and 522, respectively.

The second memory bank 60 may include a third memory block 61 and a fourth memory block 62, which include second normal areas (NM AREA2_1 and NM AREA2_2) 611 and 621 and second row hammer areas (RH AREA2_1 and RH AREA2_2) 612 and 622, respectively.

The memory device 1 may include more than two memory banks. Furthermore, each of the memory banks 50 and 60 may include more memory blocks than, for example, those illustrated in FIG. 6. For convenience of descriptions, the following descriptions will be based on the assumption that the first memory bank 50 and the second memory bank 60 are included in the memory device 1, the first memory block 51 and the second memory block 52 are included in the first memory bank 50, and the third memory block 61 and the fourth memory block 62 are included in the second memory bank 60.

The first normal areas 511 and 521 and the second normal areas 611 and 621 may be areas for storing normal data.

The first row hammer areas 512 and 522 may save counts RCN for the respective logic level combinations of an address ADD<1:N> input to the first memory bank 50.

The second row hammer areas 612 and 622 may save counts RCN for the respective logic level combinations of an address ADD<1:N> input to the second memory bank 60.

While the memory device 1 disclosed in FIG. 1 includes one memory bank 20, the memory device 1 disclosed in FIG. 6 may include two memory banks 50 and 60. For example, each of the two memory banks 50 and 60 included in the memory device 1 disclosed in FIG. 6 may have the same shape as one memory bank 20 included in the memory device 1 disclosed in FIG. 1. In one embodiment, the first memory bank 50 included in the memory device 1 disclosed in FIG. 6 may perform the same operation as the one memory bank 20 included in the memory device 1 disclosed in FIG. 1. Furthermore, the second memory bank 60 included in the memory device 1 disclosed in FIG. 6 may also perform the same operation as the one memory bank 20 included in the memory device 1 disclosed in FIG. 1.

Therefore, the configuration and operation of the internal command generation circuit 81 disclosed in FIG. 6 may correspond to those of FIGS. 1 and 2. Therefore, the configuration and operation of the target address generation circuit 82 disclosed in FIG. 6 may be described with reference to those disclosed in FIGS. 1 and 4.

However, the first and second memory banks 50 and 60 illustrated in FIG. 6 may operate according to a bank interleaving method, in which an active section and a precharge section partially overlap each other. When the first and second memory banks 50 and 60 operate according to the bank interleaving method, the active section for the first memory bank 50 and the precharge section for the second memory bank 60 may partially overlap each other, and the active section for the second memory bank 60 and the precharge section for the first memory bank 50 may partially overlap each other, depending on embodiments.

Since the first and second memory banks 50 and 60 operate according to the bank interleaving method, the active command ACT and the precharge command PCG (which are applied to the memory device 1 from an external device (e.g., memory controller) and correspond to the first memory bank 50) may correspond to the active section and the precharge section for the first memory bank 50. Similarly, the active command ACT and the precharge command PCG (which are applied to the memory device 1 from the external device (e.g., memory controller) and correspond to the second memory bank 60) may correspond to the active section and the precharge section for the second memory bank 60.

The command control circuit 84 may perform an access operation on the normal areas 511 and 521 in response to the active command ACT corresponding to the first memory bank 50. The command control circuit 84 may enter the active section corresponding to the first memory bank 50 by activating the first memory bank 50 in response to the active command ACT corresponding to the first memory bank 50. The command control circuit 84 may read/write normal data from/to the first normal areas 511 and 521 included in the first memory bank 50, in response to the read command RD and the write command WT in the active section corresponding to the first memory bank 50. When the row hammer enable signal FEN is deactivated (e.g., in an inactive state), the command control circuit 84 may precharge the first memory bank 50 in response to the precharge command PCG corresponding to the first memory bank 50. The command control circuit 84 may precharge the first memory bank 50 in response to the internal precharge command IPCG, which is generated by the internal command generation circuit 81 in response to the precharge command PCG that corresponds to the first memory bank 50. This may occur while the row hammer enable signal FEN is activated.

The command control circuit 84 may perform an access operation on the second normal areas 611 and 621 in response to the active command ACT corresponding to the second memory bank 60. The command control circuit 84 may enter the active section corresponding to the second memory bank 60 by activating the second memory bank 60 in response to the active command ACT corresponding to the second memory bank 60. The command control circuit 84 may read/write normal data from/to the second normal areas 611 and 621 included in the second memory bank 60, in response to the read command RD and the write command WT in the active section corresponding to the second memory bank 60. When the row hammer enable signal FEN is deactivated (e.g., in an inactive state), the command control circuit 84 may precharge the second memory bank 60 in response to the precharge command PCG corresponding to the second memory bank 60. The command control circuit 84 may precharge the second memory bank 60 in response to the internal precharge command IPCG, which is generated by the internal command generation circuit 81 in response to the precharge command PCG corresponding to the second memory bank 60. This may occur while the row hammer enable signal FEN is activated.

The command control circuit 84 may generate the normal area control signal NM_CON in response to the active command ACT, the read command RD, the write command WT, the precharge command PCG, the internal precharge command IPCG and the row hammer enable signal FEN, thereby controlling operations (e.g., an active operation, a read/write operation and a precharge operation) on the first normal areas 511 and 521 included in the first memory bank 50 and the second normal areas 611 and 621 included in the second memory bank 60.

The target address generation circuit 82 may perform an access operation on the first row hammer areas 512 and 522 included in the first memory bank 50. The access operation may be performed in response to the internal active command IACT, which is generated by the internal command generation circuit 81 in response to the precharge command PCG corresponding to the first memory bank 50. The target address generation circuit 82 may perform an access operation on the second row hammer areas 612 and 622 included in the second memory bank 60. This access operation may be performed in response to the internal active command IACT, which is generated by the internal command generation circuit 81 in response to the precharge command PCG corresponding to the second memory bank 60. The target address generation circuit 82 may generate the row hammer control signal RH_CON in response to the internal active command IACT, the internal precharge command IPCG, the internal read command IRD, the internal write command IWT and the initialization signal INIT, thereby controlling operations (e.g., the active operation, the precharge operation, the internal read operation, the internal write operation and the initialization operation) on the first row hammer areas 512 and 522 included in the first memory bank 50 and the second row hammer areas 612 and 622 included in the second memory bank 60.

Figure 7:
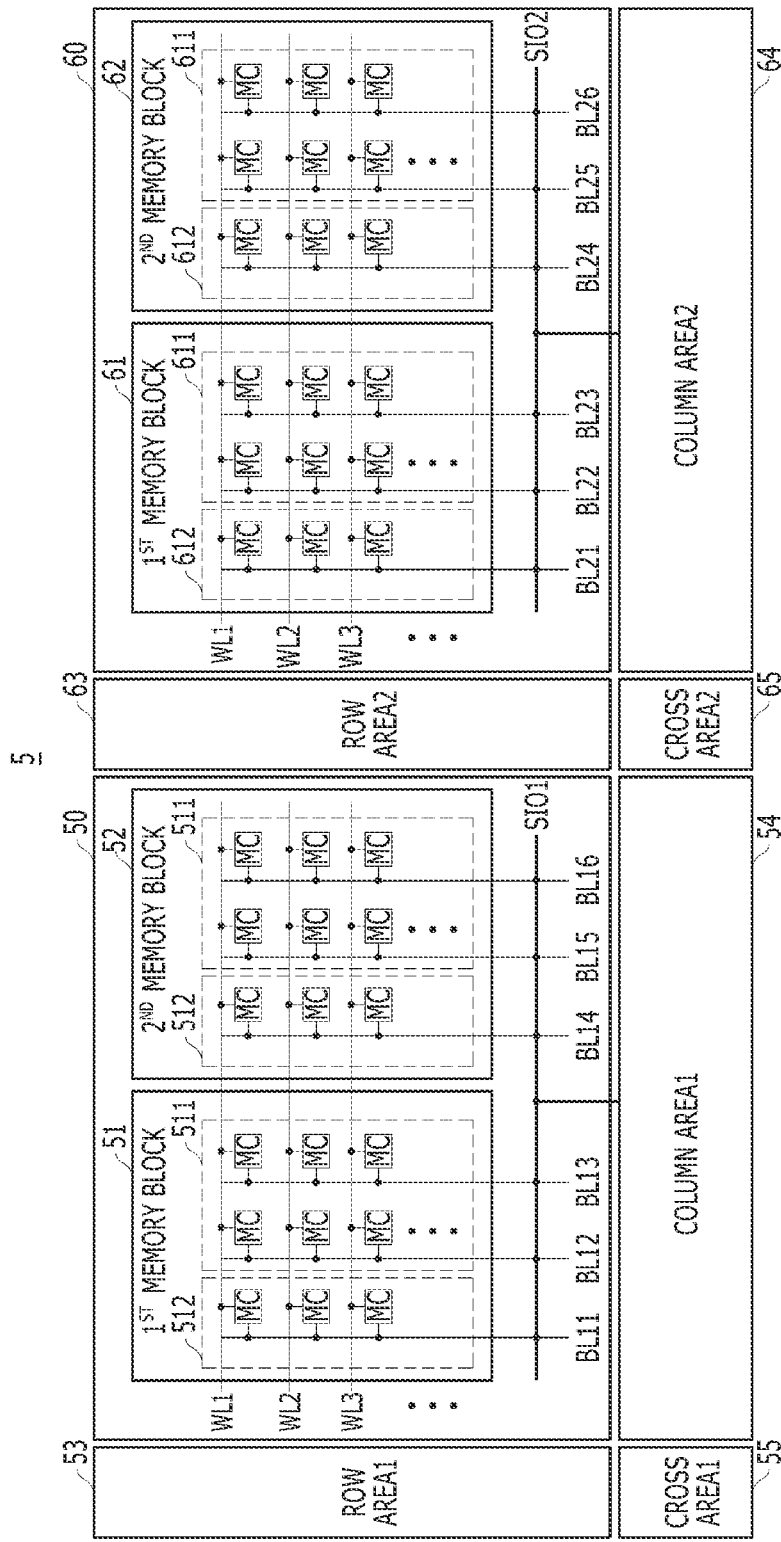
FIG. 7 illustrates an embodiment of a memory bank.

FIG. 7 is a diagram for describing an embodiment of the memory bank 50 among the components of the memory device disclosed in FIG. 6.

Referring to FIG. 7, the first memory bank 50 may include the first memory block 51 and the second memory block 52. The second memory bank 60 may include the third memory block 61 and the fourth memory block 62.

A first row area ROW AREA1 53 may be located on any one of the right or left sides of the first memory bank 50. As an example, FIG. 7 illustrates that the first row area 53 is located on the left side of the first memory bank 50. Furthermore, a first column area COLUMN AREA1 54 may be located on any one of the top or bottom sides of the first memory bank 50. As an example, FIG. 7 illustrates that the first column area 54 is located on the bottom side of the first memory bank 50. Furthermore, a first cross area CROSS AREA1 55 may be located between the first row area 53 and the first column area 54.

A second row area ROW AREA2 63 may be located on any one of the right or left sides of the second memory bank 60. As an example, FIG. 7 illustrates that the second row area 63 is located on the left side of the second memory bank 60. Furthermore, a second column area COLUMN AREA2 64 may be located on any one of the top or bottom sides of the second memory bank 60. As an example, FIG. 7 illustrates that the second column area 64 is located on the bottom side of the second memory bank 60. Furthermore, a second cross area CROSS AREA2 65 may be located between the second row area 63 and the second column area 64.

As an example, FIG. 7 illustrates that the first memory bank 50 is located on the left side of the second memory bank 60. However, this is only an embodiment. In one embodiment, the first memory bank 50 may be located on the right side of the second memory bank 60.

The first memory bank 50 may include a plurality of memory cells MC coupled between a plurality of word lines WL1, WL2, WL3 . . . and a plurality of bit lines BL11, BL12, BL13, BL14, BL15 and BL16.

The second memory bank 60 may include a plurality of memory cells MC coupled between word lines WL1, WL2, WL3 . . . and a plurality of bit lines BL21, BL22, BL23, BL24, BL25 and BL26.

The first and second memory blocks 51 and 52 included in the first memory bank 50 may share the word lines WL1, WL2, WL3, . . . which may be driven at the same time. For example, the word lines WL1, WL2, WL3, . . . , may be simultaneously driven by a word line driver located in the first row area 53.

The third and fourth memory blocks 61 and 62 included in the second memory bank 60 may share a plurality of word lines WLA, WLB, WLC, . . . , which may be driven at the same time. For example, the word lines WLA, WLB, WLC, . . . , may be simultaneously driven by a word line driver located in the second row area 63.

In the present embodiment, the first memory block 51 and the second memory block 52 share word lines WL1, WL2, WL3, . . . , and drive these word lines WL1, WL2, WL3, . . . at the same time. Also, the third memory block 61 and the fourth memory block 62 share word lines WLA, WLB, WLC, . . . and drive these word lines WLA, WLB, WLC, . . . at the same time.

In one embodiment, a plurality of word lines corresponding to the first memory block 51, a plurality of world lines corresponding to the second memory block 52, a plurality of word lines corresponding to the third memory block 61, and a plurality of word lines corresponding to the fourth memory block 62 may be independently driven. For example, a sub word line driver may be included between the first and second memory blocks 51 and 52, and a sub word line driver may be included between the third and fourth memory blocks 61 and 62. Through these sub word line drivers, the plurality of word lines corresponding to the first memory block 51 and the plurality of word lines corresponding to the second memory block 52 may be shared and driven or independently driven, and the plurality of word lines corresponding to the third memory block 61 and the plurality of word lines corresponding to the fourth memory block 62 may be shared and driven or independently driven.

The bit lines BL11, BL12 and BL13 corresponding to the first memory block 51 and the bit lines BL14, BL15 and BL16 corresponding to the second memory block 52 may be physically separated from each other. The bit lines BL21, BL22 and BL23 corresponding to the third memory block 61 and the bit lines BL24, BL25 and BL26 corresponding to the fourth memory block 62 may be physically separated from each other.

The memory cells MC coupled between the bit line BL11 of the bit lines BL11, BL12 and BL13 included in the first memory block 51 and the word lines WL1, WL2, WL3, . . . and the memory cells MC coupled between the bit line BL14 of the bit lines BL14, BL15 and BL16 included in the second memory block 52 and the word lines WL1, WL2, WL3, . . . may be used as the first row hammer areas 512 and 522.

The memory cells MC coupled between the bit line BL21 of the bit lines BL21, BL22 and BL23 included in the third memory block 61 and the word lines WLA, WLB, WLC, . . . and the memory cells MC coupled between the bit line BL24 of the plurality of bit lines BL24, BL25 and BL26 included in the fourth memory block 62 and the word lines WLA, WLB, WLC, . . . may be used as the second row hammer areas 612 and 622.

The memory cells MC coupled between the other bit lines BL12 and BL13 (which do not overlap the bit line BL11 among the plurality of bit lines BL11, BL12 and BL13 included in the first memory block 51) and the word lines WL1, WL2, WL3, . . . , and the memory cells MC coupled between the other bit lines BL15 and BL16 (which do not overlap the bit line BL14 among the plurality of bit lines BL14, BL15 and BL16 included in the second memory block 52) and the word lines WL1, WL2, WL3, . . . , may be used as the first normal areas 511 and 521.

The memory cells MC coupled between the other bit lines BL22 and BL23 (which do not overlap the bit line BL21 among the plurality of bit lines BL21, BL22 and BL23 included in the third memory block 61) and the word lines WLA, WLB, WLC, . . . , and the memory cells MC coupled between the other bit lines BL25 and BL26 (which do not overlap the bit line BL24 among the plurality of bit lines BL24, BL25 and BL26 included in the fourth memory block 62) and the word lines WLA, WLB, WLC, . . . , may serve as the second normal areas 611 and 621.

The bit lines BL12 and BL13/BL15 and BL16 included in the first normal areas 511 and 521 and the bit lines BL11/BL14 included in the first row hammer areas 512 and 522 may be coupled to the first column area 54 through a first segment line SIO1 shared thereby.

The bit lines BL22 and BL23/BL25 and BL26 included in the second normal areas 611 and 621 and the bit lines BL21/BL24 included in the second row hammer areas 612 and 622 may be coupled to the second column area 64 through a second segment line SIO2 shared thereby.

The first segment line SIO1 and the second segment line SIO2 may be physically separated from each other.

The first column area 54 may include a data input/output circuit configured to output data, transferred through the first segment line SIO1, to a destination outside (e.g., memory controller) of the memory device 1 or transfer data, received from a source outside of the memory device 1, to the first segment line SIO1. Similarly, the second column area 64 may include a data input/output circuit configured to output data, transferred through the second segment line SIO2, to a destination outside (e.g., memory controller) of the memory device 1 or transfer data, received from a source outside of the memory device 1, to the second segment line SIO2.

When the internal command generation circuit 81 generates the internal read command IRD corresponding to the first memory bank 50 in order to perform an internal read operation on the first memory bank 50, the target address generation circuit 82 may read (through the first segment line SIO1) the counts RCN for the respective logic level combinations of the address ADD<1:N>. These counts RCN may be saved in the memory cells MC coupled between word lines WL1, WL2, WL3, . . . and the bit lines BL11 and BL14 corresponding to the first row hammer areas 512 and 522. For example, the target address generation circuit 82 may perform the internal read operation of reading, through the first segment line SIO1, the count RCN saved in a first selected memory cell coupled to a word line corresponding to an input address, among the memory cells MC included in the first row hammer areas 512 and 522.

When the internal command generation circuit 81 generates the internal write command IWT corresponding to the first memory bank 50 in order to perform the internal write operation on the first memory bank 50, the target address generation circuit 82 may update the counts RCN for the respective logic level combinations (read by the internal read operation) through up-counting. Then, the target address generation circuit 82 may write (through the first segment line SIO1) the updated counts RCN to the memory cells MC coupled between the word lines WL1, WL2, WL3, . . . and the bit lines BL11 and BL14 corresponding to the first row hammer areas 512 and 522. For example, the target address generation circuit 82 may perform the internal write operation of updating the count RCN (read by the internal read operation) through up-counting, and then of transferring (through the first segment line SIO1) the updated count RCN to the first selected memory cell coupled to the word line corresponding to the input address among the memory cells MC included in the first row hammer areas 512 and 522.

The command control circuit 84 may read normal data from the memory cells MC coupled between the word lines WL1, WL2, WL3, . . . and the bit lines BL12 and BL13/BL15 and BL16 corresponding to the first normal areas 511 and 521, and may transfer the read normal data to the data output circuit included in the first column area 54 through the first segment line SIO1 during the normal read operation on the first memory bank 50. The normal read operation may be performed in response to the read command RD corresponding to the first memory bank 50. For example, the command control circuit 84 may perform the normal read operation of reading the normal data from a second selected memory cell coupled to the word line corresponding to the input address among the memory cells MC included in the normal areas 511 and 512. The command control circuit 84 may then transfer the read data to the data output circuit included in the first column area 54 through the first segment line SIO1.

The command control circuit 84 may write normal data (received through the first segment line SIO1 from the data input circuit included in the first column area 54) to the memory cells MC coupled between the word lines WL1, WL2, WL3, . . . , and the bit lines BL12 and BL13/BL15 and BL16 corresponding to the first normal areas 511 and 521, during a normal write operation on the first memory bank 50. The normal write operation may be performed in response to the write command WT corresponding to the first memory bank 50. For example, the command control circuit 84 may perform the normal write operation of saving the normal data (received through the first segment line SIO1 from the data input circuit included in the first column area 54) to the second selected memory cell coupled to the word line corresponding to the input address among the memory cells MC included in the first normal areas 511 and 521.

When the internal command generation circuit 81 generates the internal read command IRD corresponding to the second memory bank 60 in order to perform an internal read operation on the second memory bank 60, the target address generation circuit 82 may read (through the second segment line SIO2) the counts RCN for the respective logic level combinations of the address ADD<1:N>. The counts RCN may be saved in the memory cells MC coupled between the word lines WL1, WL2, WL3, . . . and the bit lines BL21 and BL24 corresponding to the second row hammer areas 612 and 622. For example, the target address generation circuit 82 may perform the internal read operation of reading (through the second segment line SIO2) the count RCN saved in the second selected memory cell coupled to a word line corresponding to an input address, among the memory cells MC included in the second row hammer areas 612 and 622.

When the internal command generation circuit 81 generates the internal write command IWT corresponding to the second memory bank 60 in order to perform an internal write operation on the second memory bank 60, the target address generation circuit 82 may update the counts RCN for the respective logic level combinations (read by the internal read operation) through up-counting. Then, the target address generation circuit 82 may write (through the second segment line SIO2) the updated counts RCN to the memory cells MC coupled between the word lines WLA, WLB, WLC, . . . and the bit lines BL21 and BL24 corresponding to the second row hammer areas 612 and 622. For example, the target address generation circuit 82 may perform the internal write operation of updating the count RCN (read by the internal read operation) through up-counting, transferring the updated count RCN to the second selected memory cell coupled to the word line corresponding to the input address among the memory cells MC included in the second row hammer areas 612 and 622 (through the second segment line SIO2), and then saving the transferred count RCN in the second selected memory cell.

The command control circuit 84 may read normal data from the memory cells MC coupled between the word lines WLA, WLB, WLC, . . . , and the bit lines BL22 and BL23/BL25 and BL26 corresponding to the second normal areas 611 and 621. The command control circuit 84 may then transfer the read normal data to the data output circuit included in the second column area 64 through the second segment line SIO2 during a normal read operation on the second memory bank 60. The normal read operation may be performed in response to the read command RD corresponding to the second memory bank 60. For example, the command control circuit 84 may perform the normal read operation of reading normal data from the second selected memory cell coupled to the word line corresponding to the input address among the memory cells MC included in the second normal areas 611 and 621, and of transferring the read data to the data output circuit included in the second column area 64, through the second segment line SIO2.

The command control circuit 84 may write normal data (received through the second segment line SIO2 from the data input circuit included in the second column area 64) to the memory cells MC coupled between the word lines WLA, WLB, WLC, . . . , and the bit lines BL22 and BL23/BL25 and BL26 corresponding to the second normal areas 611 and 621, during a normal write operation on the second memory bank 60. This normal write operation may be performed in response to the write command WT corresponding to the second memory bank 60. For example, the command control circuit 84 may perform the normal write operation of saving the normal data (received through the second segment line SIO2 from the data input circuit included in the second column area 64) to the second selected memory cell coupled to the word line corresponding to the input address among the memory cells MC included in the second normal areas 611 and 621.

Figure 8:
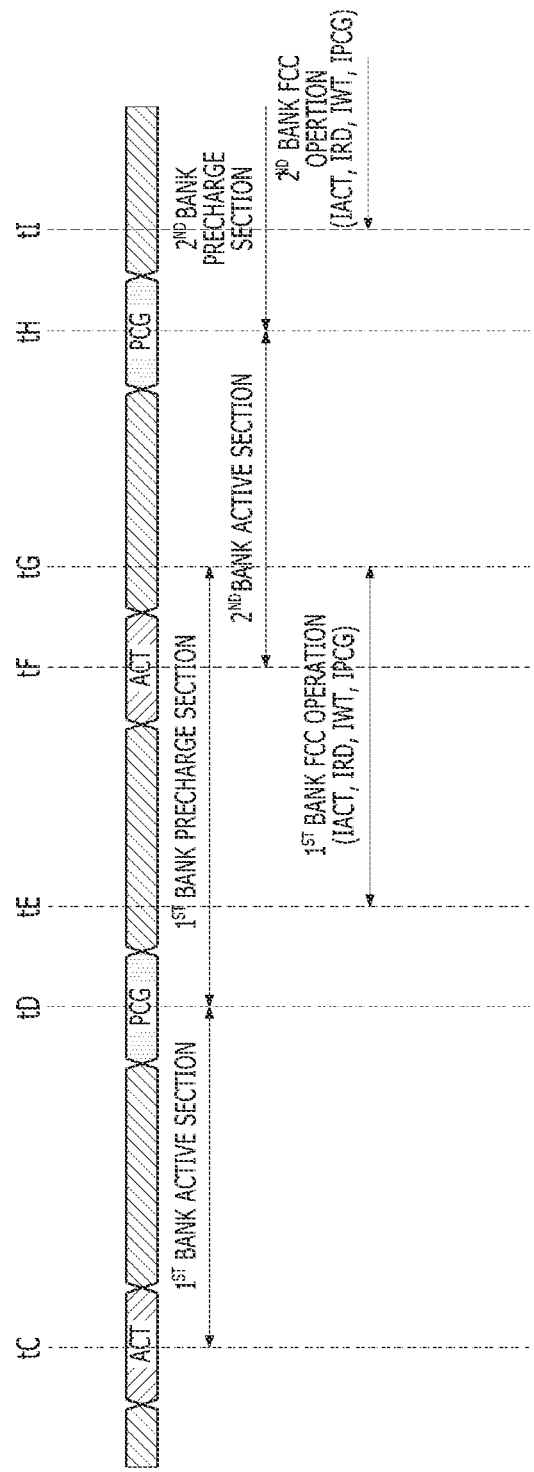
FIG. 8 illustrates an embodiment for operating a memory device.

FIG. 8 is a diagram for describing an embodiment for operating of the memory device of FIG. 6, and particularly how the first memory bank 50 and the second memory bank 60 operate according to the bank interleaving method of FIG. 6.

In this embodiment, the time period from a time point tC that a first active command ACT is input to a time point tD that a first precharge command PCG is input may be an active section $1^{ST}$ BANK ACTIVE SECTION on the first memory bank 50.

Also, the time period from a time point tF that a second active command ACT is input to a time point tH that a second precharge command PCG is input may be an active section $2^{ND}$ BANK ACTIVE SECTION on the second memory bank 60.

In operation, the memory device may enter the precharge section $1^{ST}$ BANK PRECHARGE SECTION for the first memory bank 50 in response to the input of the first precharge command PCG. At this time, when an access operation $1^{ST}$ BANK FCC OPERATION is performed on the first row hammer areas 512 and 522 included in the first memory bank 50, while the memory device has entered the precharge section $1^{ST}$ BANK PRECHARGE SECTION for the first memory bank 50, as described with reference to FIG. 5 the precharge operation on the first memory bank 50 may not be completed even at the time point tF that the second active command ACT is input. For example, the time point that the precharge operation on the first memory bank 50 is completed (e.g., a time point tG that the precharge section $1^{ST}$ BANK PRECHARGE SECTION on the first memory bank 50 is ended) may be later than the time point tF that the second active command ACT is input.

Since the first and second memory banks 50 and 60 included in one memory device 1 operate according to the bank interleaving method, the memory device may enter the active section for the second memory bank 60 while the precharge operation on the first memory bank 50 is not completed. An access operation may then be performed on the second normal areas 611 and 621 included in the second memory bank 60. Thus, the precharge section $1^{ST}$ BANK PRECHARGE SECTION for the first memory bank 50 and the active section $2^{ND}$ BANK ACTIVE SECTION for the second memory bank 60 may overlap each other.

Similarly, since the first and second memory banks 50 and 60 included in one memory device 1 operate according to the bank interleaving method, the memory device may enter the active section for the first memory bank 50 while the precharge operation on the second memory bank 60 is not completed. An access operation may then be performed on the first normal areas 511 and 521 included in the first memory bank 50. Thus, the precharge section $2^{ND}$ BANK PRECHARGE SECTION for the second memory bank 60 and the active section $1^{ST}$ BANK ACTIVE SECTION for the first memory bank 50 may overlap each other.

To summarize, as the access operation $1^{ST}$ BANK FCC OPERATION on the first row hammer areas 512 and 522 included in the first memory bank 50 is performed while the memory device has entered the precharge section 1ST BANK PRECHARGE SECTION for the first memory bank 50, the precharge section $1^{ST}$ BANK PRECHARGE SECTION for the first memory bank 50 may be delayed by the preset time tDELAY. While the precharge section $1^{ST}$ BANK PRECHARGE SECTION for the first memory bank 50 and the active section $2^{ND}$ BANK ACTIVE SECTION for the second memory bank 60 overlap each other (because the first and second memory banks 50 and 60 included in one memory device 1 may operate according to the bank interleaving method), such a phenomenon may be covered as if the phenomenon did not occur.

Similarly, as the access operation $2^{ND}$ BANK FCC OPERATION on the second row hammer areas 612 and 622 included in the second memory bank 60 is performed while the memory device has entered the precharge section $2^{ND}$ BANK PRECHARGE SECTION for the second memory bank 60, the precharge section $2^{ND}$ BANK PRECHARGE SECTION for the second memory bank 60 may be delayed by the preset time tDELAY. While the precharge section $2^{ND}$ BANK PRECHARGE SECTION for the second memory bank 60 and the active section $1^{ST}$ BANK ACTIVE SECTION for the first memory bank 50 overlap each other (because the first and second memory banks 50 and 60 included in one memory device 1 may operate according to the bank interleaving method), such a phenomenon may be covered as if the phenomenon did not occur. Although various embodiments have been described for illustrative purposes, it will be apparent to those skilled in the art that various changes and modifications may be made without departing from the spirit and scope of the invention as defined in the following claims. The embodiments may be combined to form additional embodiments.

What is claimed is:

1. A memory device, comprising:
    a memory bank comprising a plurality of memory blocks, each divided into a normal area and a row hammer area sharing a plurality of word lines;
    a command control circuit suitable for activating the normal area and the row hammer area included in the memory bank, and then performing an access operation on the normal area, in response to an active command;
    an internal command generation circuit suitable for generating an internal command in response to a precharge command;
    a target address generation circuit suitable for saving a count for each logic level combination of a received address in the row hammer area by sequentially performing an internal read operation and an internal write operation on the row hammer area in response to the internal command, and setting an address corresponding to the count as a target address when the count satisfies a preset condition; and
    a refresh control circuit suitable for controlling a smart refresh operation on the target address,
    wherein bit lines included in the normal area and bit lines included in the row hammer area share a segment line, and
    wherein the target address generation circuit reads and increases through up-counting the count of the row hammer area corresponding to the input address, through the segment line, during the internal read operation, and writes the increased count to the row hammer area corresponding to the input address through the segment line during the internal write operation.

2. The memory device of claim 1, wherein the internal command generation circuit generates an internal active command among the internal command in response to the precharge command and generates an internal precharge command among the internal command after a preset time has elapsed.

3. The memory device of claim 2, wherein the command control circuit precharges the normal area and the row hammer area included in the memory bank in response to the internal precharge command.

4. The memory device of claim 2, wherein the internal command generation circuit comprises:
    a first generation circuit suitable for enabling the internal active command during the preset time in response to the precharge command; and
    a second generation circuit suitable for sequentially generating an internal read command and an internal write command in an active section of the internal active command, and generating the internal precharge command in response to the disabled internal active command.

5. The memory device of claim 4, wherein the target address generation circuit comprises:
   an area control circuit suitable for increasing the count read by performing the internal read operation on the row hammer area corresponding to an input address, the count increased through up-counting in response to the internal read command, and saving the increased count in the row hammer area corresponding to the input address by performing the internal write operation in response to the internal write command;
   a saving circuit suitable for comparing the increased count to a saved count, saving the increased count by replacing the saved count with the increased count, and generating a flag signal, when the increased count is larger than the saved count, and resetting the saved count in response to a reset signal; and
   a target address output circuit suitable for storing the input address as the target address in response to the generated flag signal, outputting the target address to the memory bank during the smart refresh operation, and generating the reset signal after the smart refresh operation is performed.

6. The memory device of claim 5, wherein the area control circuit reads the count saved in a first selected memory cell coupled to a word line corresponding to the input address, among first memory cells included in the row hammer area, through the segment line during the internal read operation,
   writes the increased count to the first selected memory cell through the segment line during the internal write operation, and
   resets the count saved in a target memory cell coupled to a word line corresponding to the target address, among the first memory cells, in response to the reset signal.

7. The memory device of claim 6, wherein the command control circuit reads first data from a second selected memory cell coupled to a word line corresponding to the input address among second memory cells included in the normal area and outputs the read first data through the segment line during a normal read operation, and
   writes second data received through the segment line to the second selected memory cell during a normal write operation.

8. The memory device of claim 1, wherein the smart refresh operation includes an operation of refreshing one or more word lines arranged adjacent to a word line corresponding to the target address, among the plurality of word lines included in the memory bank.

9. A method of operating a memory device, which includes a first memory bank having a plurality of memory blocks each divided into a first normal area and a first row hammer area sharing a first plurality of word lines and a second memory bank having a plurality of memory blocks each divided into a second normal area and a second row hammer area sharing a second plurality of word lines, the method comprising:
   activating the first normal area and the first row hammer area included in the first memory bank in an active section for the first memory bank, or activating the second normal area and the second row hammer area included in the second memory bank in an active section for the second memory bank, in response to an active command;
   performing an access operation on the first and second normal areas according to a bank interleaving method, in which the active section for the first memory bank partially overlaps a precharge section for the second memory bank and the active section for the second memory bank partially overlaps a precharge section for the first memory bank;
   generating an internal command in response to a precharge command corresponding to the precharge section of the first or second memory bank in a row hammer enable section;
   saving a count for each logic level combination of a received address in the first or second row hammer area by sequentially performing an internal read operation and internal write operation on the first or second row hammer area in response to the internal command, and setting an address corresponding to the count as a target address when the count satisfies a preset condition; and
   performing a smart refresh operation on the target address,
   wherein bit lines included in the first normal area and bit lines included in the first row hammer area share a first segment line, and bit lines included in the second normal area and bit lines included in the second row hammer area share a second segment line, and
   wherein setting an address corresponding to the count as the target address comprises:
   reading and increasing through up-counting the count of the first or second row hammer area corresponding to the input address, through the first or second segment line, during the internal read operation, and
   writing the increased count to the first or second row hammer area corresponding to the input address through the first or second segment line during the internal write operation.

10. The method of claim 9, further comprising:
    generating an internal precharge command among the internal command after a preset time has elapsed from a point of time that an internal active command among the internal command was generated.

11. The method of claim 10, further comprising:
    precharging the first normal area and the first row hammer area included in the first memory bank or precharging the second normal area and the second row hammer area included in the second memory bank, in response to the internal precharge command in the row hammer enable section.

12. The method of claim 10, wherein generating the internal active command comprises enabling the internal active command for the preset time in response to the precharge command.

13. The method of claim 12, wherein generating the internal precharge command comprises generating the internal precharge command in response to the disabled internal active command.

14. The method of claim 13, further comprising:
    sequentially generating an internal read command and an internal write command in an active section of the internal active command.

15. The method of claim 14, wherein setting an address corresponding to the count as the target address comprises:
    increasing the count read by performing the internal read operation on the first or second row hammer area corresponding to an input address, the count increased through up-counting in response to the internal read command, and saving the increased count in the first or second row hammer area corresponding to the input address by performing the internal write operation in response to the internal write command;

comparing the increased count to a saved count, saving the increased count by replacing the saved count with the increased count, and generating a flag signal when the increased count is larger than the saved count, and resetting the saved count in response to a reset signal;

storing the input address as the target address in response to the generated flag signal, and outputting the target address to the first or second memory bank during the smart refresh operation; and generating the reset signal after the smart refresh operation is performed.

16. The method of claim 15, wherein:

saving the increased count in the first or second row hammer area comprises:

reading the count saved in a first selected memory cell coupled to a word line corresponding to the input address, among first memory cells included in the first row hammer area or second memory cells included in the second row hammer area, through the first or second segment line during the internal read operation;

writing the increased count to the first selected memory cell through the first or second segment line during the internal write operation; and resetting the count saved in a target memory cell coupled to a word line corresponding to the target address among the first or second memory cells, in response to the reset signal.

17. The method of claim 16, further comprising:

reading first data from a second selected memory cell coupled to a word line corresponding to the input address among third memory cells included the first normal area or fourth memory cells included in the second normal area, and outputting the read first data through the first or second segment line, during a normal read operation; and writing second data, received through the first or second segment line, to the second selected memory cell during a normal write operation.

18. The method of claim 9, further comprising:

precharging the first normal area and the first row hammer area included in the first memory bank or precharging the second normal area and the second row hammer area included in second memory bank in response to the precharge command in a row hammer disable section.

19. The device of claim 9, wherein the smart refresh operation includes an operation of refreshing one or more word lines arranged adjacent to a word line corresponding to the target address, among the first and second plurality of word lines included in each of the first and second memory banks.

* * * * *